(12) United States Patent
Collados Asensio et al.

(10) Patent No.: US 9,118,366 B2
(45) Date of Patent: Aug. 25, 2015

(54) METHOD AND APPARATUS FOR CALIBRATING AN ENVELOPE TRACKING SYSTEM

(71) Applicant: MediaTek Singapore Pte. Ltd., Singapore (SG)

(72) Inventors: Manel Collados Asensio, Aylesford (GB); Johannes Harrebek, Aalborg (DK); Bernard Mark Tenbroek, West Malling (GB)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 13/798,099

(22) Filed: Mar. 13, 2013

(65) Prior Publication Data
US 2014/0073272 A1  Mar. 13, 2014

Related U.S. Application Data

(60) Provisional application No. 61/700,282, filed on Sep. 12, 2012.

(51) Int. Cl.
*H04B 1/04* (2006.01)
*H04B 1/16* (2006.01)
(Continued)

(52) U.S. Cl.
CPC ............ *H04B 1/0475* (2013.01); *H03F 1/0211* (2013.01); *H03F 3/24* (2013.01); *H04B 1/04* (2013.01); *H04B 1/1607* (2013.01)

(58) Field of Classification Search
CPC ..... H03F 1/0222; H03F 1/025; H03F 1/0266; H03F 2200/102; H03F 2200/451; H03F 2200/504; H03F 2201/3227; H03F 3/24; H04B 1/02; H04B 1/04; H04B 1/0475; H04B 1/1607; H04B 17/13; H04B 17/21; H04B 2001/0408; H04B 2001/0416
USPC .......... 455/67.11, 114.1, 114.2, 114.3, 115.1, 455/115.2, 127.1, 572, 574; 375/296, 297, 375/300
See application file for complete search history.

(56) References Cited

U.S. PATENT DOCUMENTS

| 7,412,469 | B2 | 8/2008 | Dalipi |
| 7,415,252 | B2 | 8/2008 | Jelonnek |
| 7,522,676 | B2 * | 4/2009 | Matero .......................... 375/295 |

(Continued)

FOREIGN PATENT DOCUMENTS

| EP | 0801465 B1 | 6/2000 |
| EP | 0988694 B1 | 6/2005 |

(Continued)

*Primary Examiner* — Quochien B Vuong
(74) *Attorney, Agent, or Firm* — Winston Hsu; Scott Margo

(57) ABSTRACT

A method of calibrating an envelope tracking system for a supply voltage for a power amplifier module within a radio frequency (RF) transmitter module of a wireless communication unit. The method includes, within at least one signal processing module of the wireless communication unit, applying a training signal having an envelope that varies with time to an input of the RF transmitter module, receiving at least an indication of instantaneous output signal values for the power amplifier module in response to the training signal, calculating instantaneous gain values based at least partly on the received output power values, and adjusting a mapping function between an instantaneous envelope of a waveform signal to be amplified by the power amplifier module and the power amplifier module supply voltage to achieve a constant power amplifier module gain.

20 Claims, 11 Drawing Sheets

(51) Int. Cl.
*H03F 1/02* (2006.01)
*H03F 3/24* (2006.01)

(56) References Cited

U.S. PATENT DOCUMENTS

| | | |
|---|---|---|
| 8,194,785 B2 * | 6/2012 | Zolfaghari et al. ............ 375/297 |
| 8,340,604 B2 | 12/2012 | Drogi |
| 8,478,213 B2 * | 7/2013 | Muhammad ................ 455/127.1 |
| 8,489,042 B1 * | 7/2013 | Hietala ....................... 455/114.3 |
| 8,737,940 B1 * | 5/2014 | Langer et al. .............. 455/127.1 |
| 2012/0019320 A1 | 1/2012 | Cummins |
| 2012/0034893 A1 | 2/2012 | Baxter |
| 2012/0200354 A1 * | 8/2012 | Ripley et al. .................. 330/131 |
| 2012/0249238 A1 | 10/2012 | Bartram |
| 2012/0306572 A1 * | 12/2012 | Hietala et al. ................. 330/131 |

FOREIGN PATENT DOCUMENTS

| | | |
|---|---|---|
| EP | 0995261 B1 | 2/2006 |
| EP | 1746720 B1 | 4/2008 |
| EP | 1590893 B1 | 1/2009 |
| EP | 2296266 A1 | 3/2011 |
| WO | 0158026 A2 | 8/2001 |
| WO | 03075469 A2 | 9/2003 |
| WO | 2004075397 A2 | 9/2004 |
| WO | 2006019612 A1 | 2/2006 |
| WO | 2010102441 A1 | 9/2010 |
| WO | 2012109227 A2 | 8/2012 |

* cited by examiner

METHOD AND APPARATUS FOR CALIBRATING AN ENVELOPE TRACKING SYSTEM

CROSS REFERENCE TO RELATED APPLICATIONS

This application claims the benefit of U.S. provisional application No. 61/700,282, filed on Sep. 12, 2012 and incorporated herein by reference.

BACKGROUND

The field of this invention relates to a method and apparatus for calibrating an envelope tracking system, and in particular to a method and apparatus for calibrating an envelope tracking system for a supply voltage for a power amplifier module within a radio frequency (RF) transmitter module of a wireless communication unit.

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed. One technique known as envelope tracking relates to modulating the PA supply voltage to match (track) the envelope of the radio frequency waveform being transmitted by the RF PA. With envelope tracking, the instantaneous PA supply voltage (VPA) of the wireless transmitter is caused to approximately track the instantaneous envelope (ENV) of the transmitted RF signal. Thus, since the power dissipation in the PA is proportional to the difference between its supply voltage and output voltage, envelope tracking enables an increase in PA efficiency, reduced heat dissipation, improved linearity and increased maximum output power, whilst allowing the PA to produce the intended RF output.

FIG. 1 illustrates a graphical representation 100 of two alternative PA supply voltage techniques according to the related art; a first technique that provides a fixed supply voltage 105 to a PA, and a second technique whereby the PA supply voltage is modulated to track the RF envelope waveform 115. In the fixed supply case, excess PA supply voltage headroom 110 is used (and thereby potentially wasted), irrespective of the nature of the modulated RF waveform being amplified. However, for example in the PA supply voltage tracking of the RF modulated envelope case 115, excess PA supply voltage headroom can be reduced 120 by modulating the RF PA supply, thereby enabling the PA supply to accurately track the instant RF envelope.

The mapping function between ENV and VPA is critical for optimum performance (efficiency, gain, and adjacent channel power (ACP)). Also critical to system performance is timing alignment between the RF signal and VPA at the PA.

Envelope-tracking can be combined with digital pre-distortion (DPD) on the RF signal to improve ACP robustness. Since the ET system is often a multichip implementation involving function blocks in digital baseband (BB), analogue BB, RF transceiver, power management and PA, consistent ET system performance cannot easily be guaranteed across all devices by hardware. There is therefore a need for some level of transceiver calibration in order to accurately map and centre the ET performance of each device leaving the production line. To make envelope-tracking a cost-effective technology, it is desirable to minimize any extra production calibration time and/or use of external characterisation equipment.

Thus, there is a need for an efficient and cost effective solution to the problem of ET system calibration. In particular, it would therefore be advantageous for an on-board auto-calibration method that compensates for part-to-part variation but preferably does not add any extra testing costs of significance.

SUMMARY

Accordingly, the invention seeks to mitigate, alleviate or eliminate one or more of the above mentioned disadvantages singly or in any combination. Aspects of the invention provide a method and apparatus for calibrating an envelope tracking system for a supply voltage for a power amplifier module within a radio frequency, RF, transmitter module of a wireless communication unit.

According to a first aspect of the invention, there is provided a method comprising, within at least one signal processing module of the wireless communication unit: applying a training signal comprising an envelope that varies with time to an input of the RF transmitter module; receiving at least an indication of at least one instantaneous output signal value for the power amplifier module in response to the training signal; calculating at least one instantaneous gain value based at least partly on the received output signal values; and adjusting a mapping function between an instantaneous envelope of a waveform signal to be amplified by the power amplifier module and the power amplifier module supply voltage to achieve a substantially constant power amplifier module gain.

In this manner, an efficient and cost effective solution to the known problems of ET system calibration is provided. In addition, the method and apparatus may be applied to an on-board auto-calibration method that compensates for part-to-part variation without significantly incurring any extra testing costs.

According to a second aspect of the invention, there is provided a non-transitory computer program product comprising executable program code for calibrating an envelope tracking system for a supply voltage for a power amplifier module within a radio frequency, RF, transmitter module of a wireless communication unit, the executable program code operable for, when executed at a communication unit, performing the method of the first aspect.

According to a third aspect of the invention, there is provided a communication unit comprising: a radio frequency, RF, transmitter module comprising an envelope tracking system for a supply voltage for a power amplifier module within the RF transmitter module; and at least one signal processing module for calibrating envelope tracking system. The at least one signal processing module and arranged to: apply a training signal comprising an envelope that varies with time to an input of the RF transmitter module; receive at least an indication of at least one instantaneous output signal value for the power amplifier module in response to the training signal; calculate at least one instantaneous gain value based at least partly on the received output signal value; and adjust a mapping function between at least one instantaneous envelope of a waveform signal to be amplified by the power amplifier module and the power amplifier module supply voltage to achieve a substantially constant power amplifier module gain.

According to a fourth aspect of the invention, there is provided an integrated circuit for a communication unit comprising a radio frequency, RF, transmitter module comprising an envelope tracking system for a supply voltage for a power amplifier module within the RF transmitter module. The integrated circuit comprises at least one signal processing module for calibrating the envelope tracking system. The at least one signal processing module being arranged to: apply a training signal comprising an envelope that varies with time to an input of the RF transmitter module; receive at least an indication of at least one instantaneous output signal value for the power amplifier module in response to the training signal; calculate at least one instantaneous gain value based at least partly on the received output signal values; and adjust a mapping function between at least one instantaneous envelope of a waveform signal to be amplified by the power amplifier module and the power amplifier module supply voltage to achieve a substantially constant power amplifier module gain.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
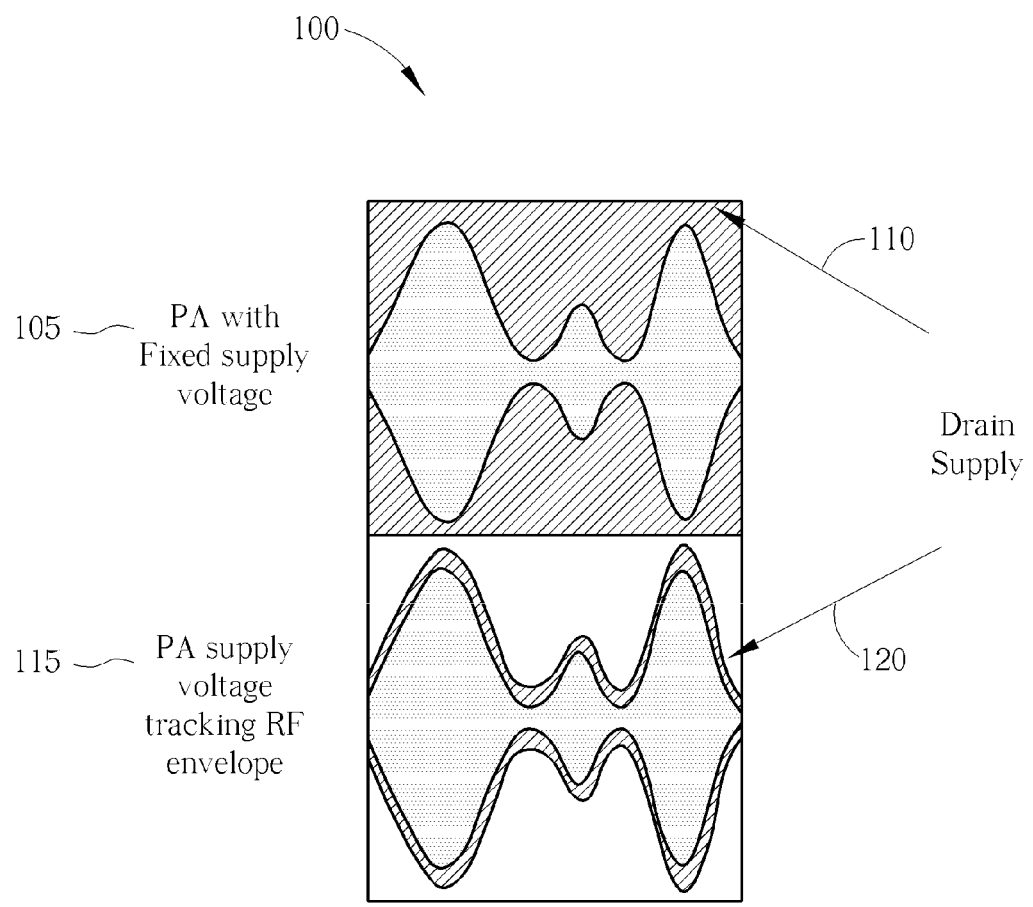
FIG. 1 illustrates a graphical representation of two alternative PA supply voltage techniques according to the related art.
Figure 2:
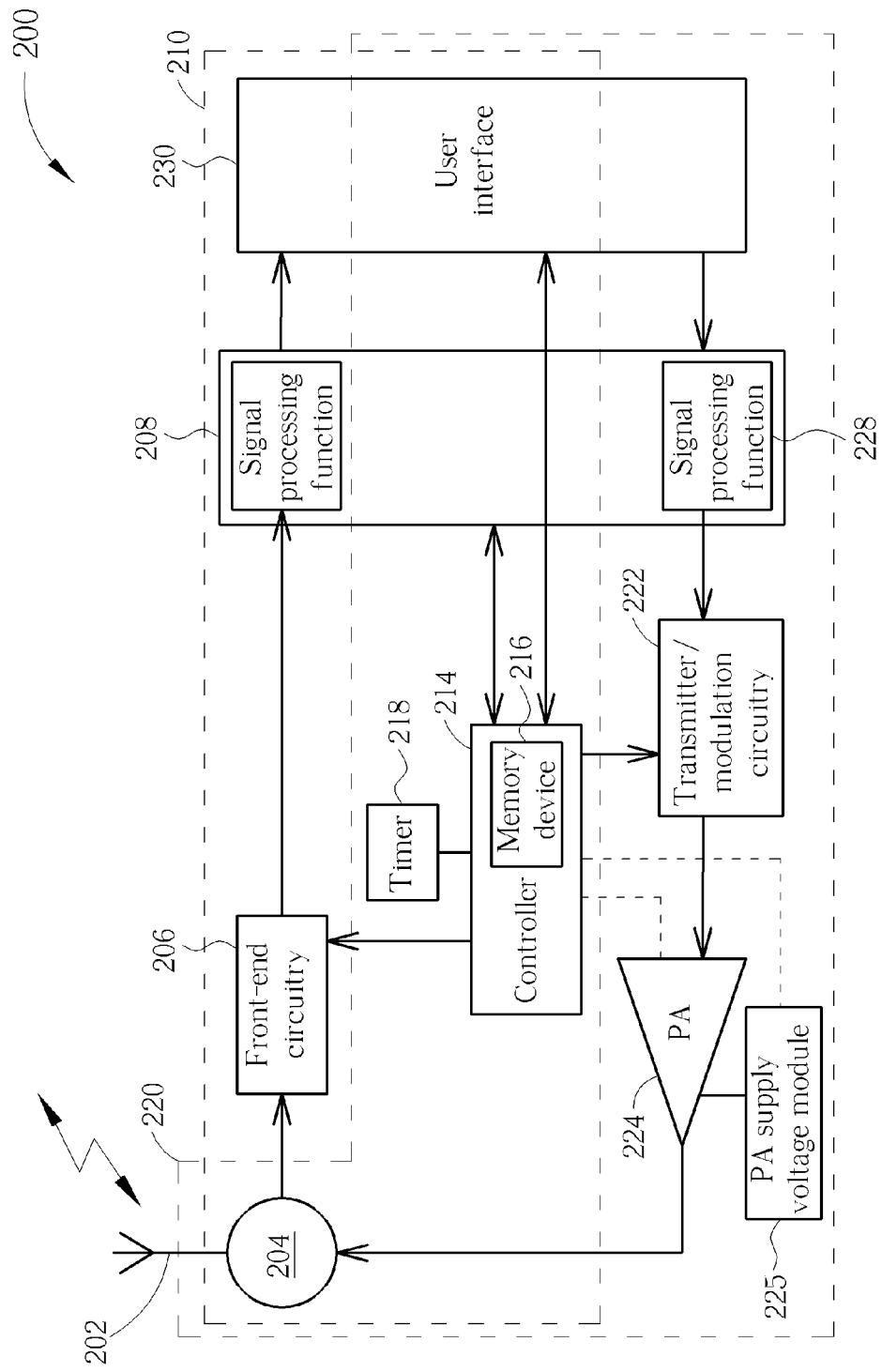
FIG. 2 illustrates a simplified block diagram of an example of a wireless communication unit.

Referring first to FIG. 2, a block diagram of a wireless communication unit (sometimes referred to as a mobile subscriber unit (MS) in the context of cellular communications or a user equipment (UE) in terms of a $3^{rd}$ generation partnership project (3GPP™) communication system) is shown, in accordance with one example embodiment of the invention. The wireless communication unit 200 contains an antenna 202 preferably coupled to a duplex filter or antenna switch 204 that provides isolation between receive and transmit chains within the wireless communication unit 200.

The receiver chain 210, as known in the art, includes receiver front-end circuitry 206 (effectively providing reception, filtering and intermediate or base-band frequency conversion). The front-end circuitry 206 is coupled to a signal processing function 208. An output from the signal processing function 208 is provided to a suitable user interface 230, which may encompass a screen or flat panel display. A controller 214 maintains overall subscriber unit control and is coupled to the receiver front-end circuitry 206 and the signal processing function 208 (generally realised by a digital signal processor (DSP)). The controller 214 is also coupled to a memory device 216 that selectively stores various operating regimes, such as decoding/encoding functions, synchronisation patterns, code sequences, and the like.

In accordance with examples of the invention, the memory device 216 stores modulation data, and power supply data for use in supply voltage control to track the envelope of the radio frequency waveform to be output by the wireless communication unit 200. Furthermore, a timer 218 is operably coupled to the controller 214 to control the timing of operations (transmission or reception of time-dependent signals and in a transmit sense the time domain variation of the PA supply voltage within the wireless communication unit 200).

As regards the transmit chain, this essentially includes the user interface 230, which may encompass a keypad or touch screen, coupled in series via signal processing function 228 to transmitter/modulation circuitry 222. The transmitter/modulation circuitry 222 processes input signals for transmission and modulates and up-converts these signals to a radio frequency (RF) signal for amplifying in the power amplifier (PA) module or integrated circuit 224. RF signals amplified by the PA module or PA integrated circuit 224 are passed to the antenna 202. The transmitter/modulation circuitry 222, power amplifier 224 and PA supply voltage module 225 are each operationally responsive to the controller 214, with the PA supply voltage module 225 additionally responding to a reproduction of the envelope modulated waveform from the transmitter/modulation circuitry 222.

The signal processor function 228 in the transmit chain may be implemented as distinct from the processor 208 in the receive chain 210. Alternatively, a single processor may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

Furthermore, in accordance with examples of the invention, the transmitter/modulation circuitry 222, together with power amplifier 224, PA supply voltage 225, memory device 216, timer 218 and controller 214 have been adapted to generate a power supply to be applied to the PA 224. For example, a power supply is generated that is suitable for a wideband linear power amplifier, and configured to track the envelope waveform applied to the PA 224.

Figure 3:
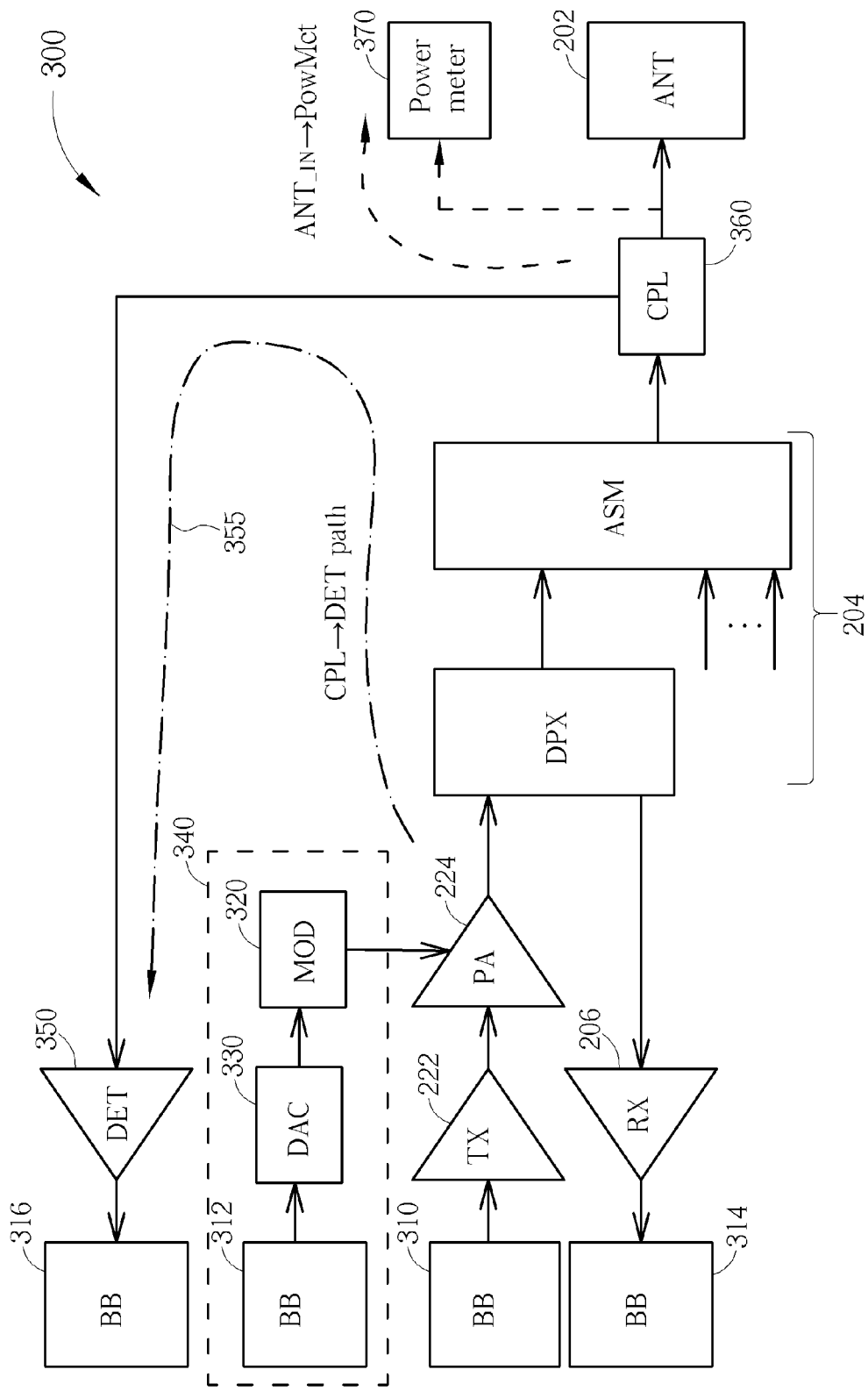
FIG. 3 illustrates a simplified generic block diagram of an example of a part of an RF transceiver architecture.

Referring now to FIG. 3, there is illustrated a generic example block diagram of a part of an RF transceiver architecture 300 of a wireless communication unit, such as the wireless communication unit 200 illustrated in FIG. 2. In the transmit direction, the transceiver architecture 300 comprises transmitter/modulation circuitry 222 operably coupled between a baseband component (denoted as "BB" in FIG. 3) 310, for example residing within the signal processing function 228 and/or the controller 214 of FIG. 2, and a PA module (denoted as "PA" in FIG. 3) 224. The PA module 224 is operably coupled to the antenna (denoted as "ANT" in FIG. 3) 202 via a duplex filter (DPX) and an antenna switch module (ASM), illustrated generally at 204. A PA supply voltage modulator (denoted as "MOS" in FIG. 3) 320 is arranged to modulate the supply voltage to the PA module 224 in accordance with a signal received from a further baseband component (denoted as "BB" in FIG. 3) 312, for example residing within the controller 214 of FIG. 2, via a digital-to-analogue converter (DAC) 330. In this manner, the PA supply voltage modulator 320, DAC 330 and corresponding baseband component 312 may be configured to perform envelope tracking modulation of the supply voltage provided to the PA module 224 such that the supply voltage provided to the PA module 224 substantially tracks an envelope of a RF waveform being amplified by the PA module 224. Accordingly, the PA supply voltage modulator 320, DAC 330 and corresponding baseband component 312 may form (at least a part of) an envelope tracking system 340 of the transceiver architecture 300. In the receive direction, the transceiver architecture 300 comprises receiver front-end circuitry (denoted as "RX" in FIG. 3) 206 operably coupled between the duplex filter and a further baseband component (denoted as "BB" in FIG. 3) 314, for example residing in the signal processing function 208 and/or the controller 214 of FIG. 2.

As previously mentioned, the mapping function between the envelope of the RF waveform being amplified and the modulation of the PA supply voltage is critical for optimum performance (efficiency, gain, and adjacent channel power (ACP)). Also critical to system performance is timing alignment between the RF signal and VPA at the PA. To this end, in the illustrated example, the transceiver architecture 300 illustrated in FIG. 3 further comprises a detection component (denoted as "DET" in FIG. 3) 350 arranged to receive an indication of an output of the PA module 224, and to enable the detection of the mapping and alignment of the envelope tracking system, as described in greater detail below.

In the illustrated example, the detection component 350 is illustrated as comprising a discrete component within the transceiver architecture 300, arranged to receive an indication of an output signal of the PA module 224, and to output an indication of a detected output power of the PA module 224 to a baseband component (denoted as "BB" in FIG. 3) 316, for example residing within the controller 214 of FIG. 2. The detection component 350 may comprise functionality such as amplification, down-mixing, analogue-to-digital conversion, etc. In the illustrated example, the detection component 350 is operably coupled to an antenna coupler (CPL) 360, and arranged to receive an indication of the output signal of the PA module 224 in the form of the RF signal provided to the antenna 202. Advantageously, by using the RF signal provided to the antenna 202 as the indication of the output signal of the PA module 224 in this manner, variations within the duplex filter and antenna switch module 204 may also be compensated for during any calibration subsequently performed based on the detected output power signal generated by the detection component 350.

It will be apparent that the present invention is not limited to the specific example transceiver architecture 300 illustrated in FIG. 3, and may equally be applied to other transceiver architectures. For example, in some alternative architectures the detection component 350 may be operably coupled directly to the output of the PA module 224 and arranged to receive an indication of the output signal of the PA module 224 substantially directly. In some further alternative architectures the detection component 350 may be at least partially merged within the receiver front-end circuitry 206, and arranged to receive an indication of the output signal of the PA module 224 via the duplex filter. In this manner, the detection component 350 could re-use at least some of the functionality of the receiver front-end circuitry 206 such as ADCs, baseband functionality, etc.

Figure 4:
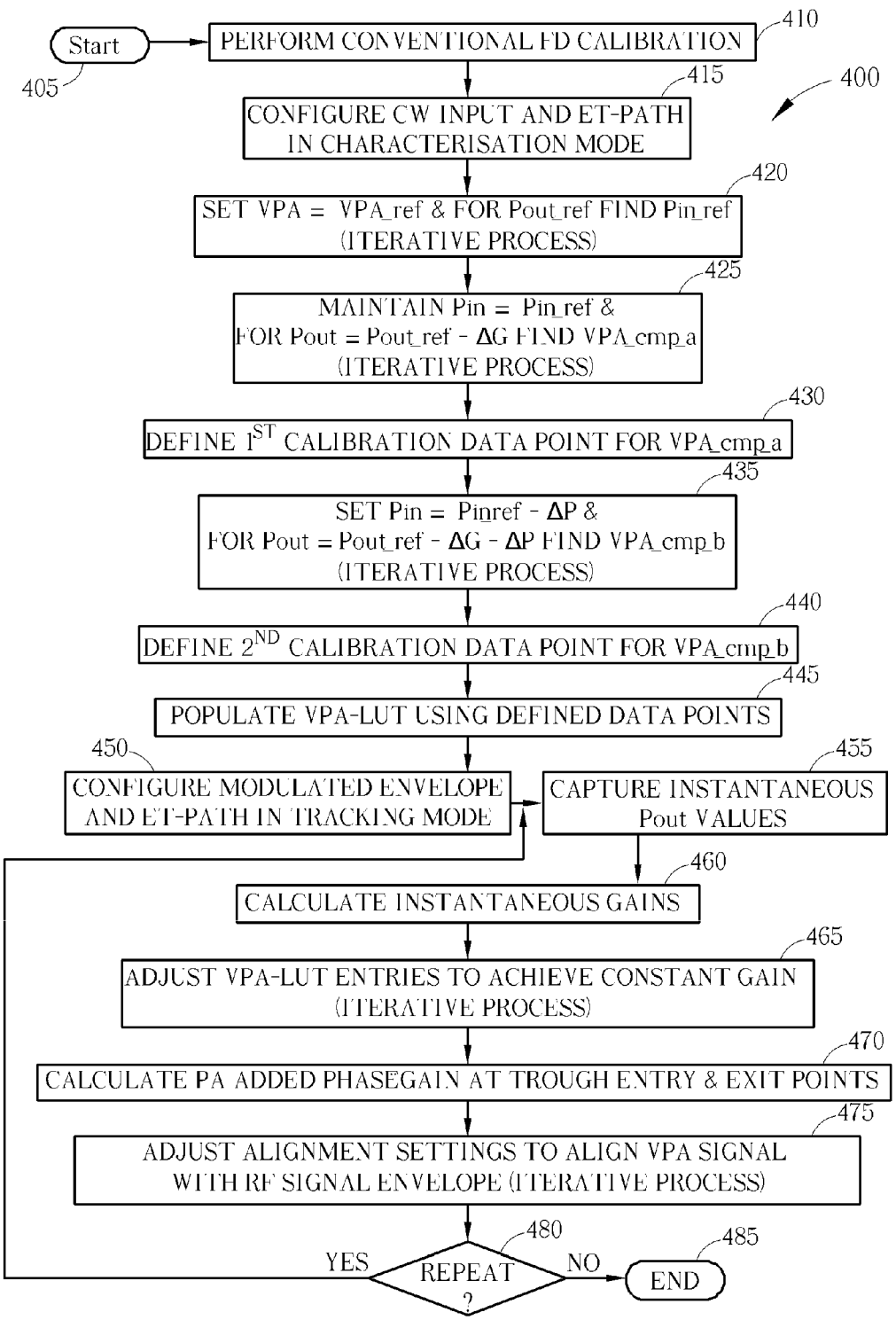
FIG. 4 illustrates a simplified flowchart of an example of a method of calibrating at least a part of an envelope tracking system within an RF transceiver.

Referring now to FIG. 4, there is illustrated a simplified flowchart 400 of an example of a method of calibrating at least a part of an envelope tracking system within an RF transceiver, such as the envelope tracking system 340 of FIG. 3. In the example illustrated in FIG. 3, the method of FIG. 4 may be implemented within one or more of the baseband components 310, 312, 314, 316.

The method starts at step 405, and moves on to step 410 where conventional fixed-drain calibration of a transmit chain of the RF transceiver is performed in order to calibrate the PA and analogue transmit gain steps. Such fixed-drain calibration may comprise, for example, a first step whereby the detection feedback path (CPL to DET path 355 in FIG. 3) is calibrated using at least one measurement obtained by way of an external power meter 370. Once the detection feedback path 355 has been calibrated, and it provides accurate power measurements, a lookup table (LUT) may be created containing, for each desired output power range, corresponding baseband, transmitter/modulation circuitry and PA gain settings. In addition, a lookup table (LUT) within the baseband component 312 of the envelope tracking system 340 for storing constant PA supply voltage values and their respective PA output power values may be populated using the detection component 350.

Note that the PA supply voltage value entries derived at this stage of the illustrated example during fixed drain calibration will be based on a fixed PA supply voltage within the RF transceiver (as opposed to an instantaneous envelope tracking PA supply voltage).

Having performed the fixed-drain calibration, the next stage in the method illustrated in FIG. 4 comprises performing an initial (coarse) calibration of the envelope tracking system. This coarse calibration stage begins at step 415 where the baseband component(s) is/are configured to produce a continuous wave to be output by the transmit chain of the transceiver, and the envelope tracking path is configured to operate in a characterisation mode. For example the baseband component(s) may be configured to produce the continuous wave:

$$z(t) = A \cdot \exp(j\omega_0 t) \quad \text{[Equation 1]}$$

If desired, the continuous wave may be duty cycled to reduce the average power and have thermal conditions closer to the conditions in the field. The envelope tracking path may be considered to be in a characterisation mode when the PA supply voltage is not derived from the envelope of the waveform signal to be amplified, but set to a reference voltage (VPA_ref). VPA_ref may be a platform-dependent, predefined voltage chosen based on lab characterization or datasheet data of the particular PA being used in the system. The actual VPA_ref voltage at the PA supply will typically vary from part to part due to component variations within the supply voltage path (e.g. within the PA supply voltage modulator 320, DAC 330 and corresponding baseband component 312 in the example illustrated in FIG. 3.). However, the proposed calibration method herein described is tolerant of such variations, as will become apparent.

Having configured the baseband component(s) to produce a continuous wave and the envelope tracking path to operate in a characterisation mode (i.e. with the PA supply voltage VPA set to the constant reference voltage (VPA_ref)), the method moves on to step 420, where reference data point values are determined for an upper limit of the 'back-off' (linear) operating region of the PA module, where the PA module is most efficient. Accordingly, in the illustrated example a reference input power signal (Pin_ref) to the PA module is found that generates a predefined reference output power signal (Pout_ref) when the PA supply voltage is set to the constant reference voltage (VPA_ref). In particular, the reference voltage (VPA_ref) and the predefined reference output power signal (Pout_ref) are chosen such that the PA is biased towards the upper limit of the back-off region of operation.

In the illustrated example, this is an iterative process where, for the example illustrated in FIG. 3, the output power of the PA module 224 is detected by the detection component 350 and corresponding baseband component 316, and at least an indication thereof may be fed back to the baseband component 310 responsible for outputting the RF waveform to the PA module 224 via the transmitter/modulation circuitry 222. In this manner, the baseband component 310 may iteratively adjust the input power of the RF waveform signal provided to the PA module 224 via the transmitter/modulation circuitry 222, in response to output power indications received from the detection feedback path comprising the detection component 350 and corresponding baseband component 316, until the predefined reference output power signal (Pout_ref) is reached. For example, the input power (Pin) may be iteratively adjusted based on Equation 2 below:

$$Pin(k) = Pin(k-1) + (Pout\_ref - Pout(k-1)) \quad \text{[Equation 2]}$$

where power is expressed in dBm. Alternatively Equation 2 could be expressed in mW, or other units, and the iterative adjustment done accordingly. The predefined values for the constant reference voltage (VPA_ref) and the reference output power signal (Pout_ref) may be chosen in accordance with the particular PA module, duplex filter and antenna switch module used.

Figure 5:
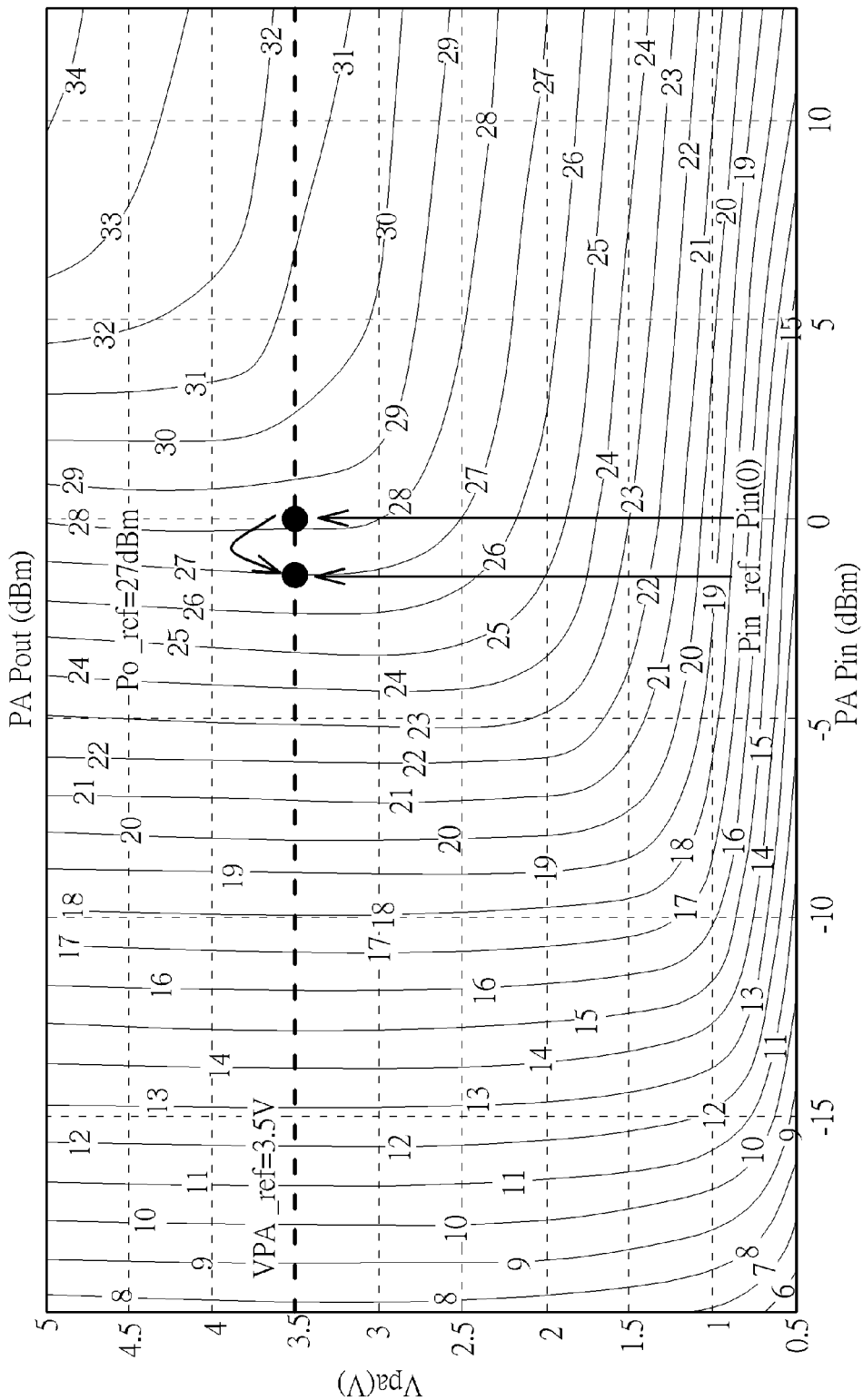
FIGS. 5 and 6 illustrate graphs showing examples of a relationship between voltage supply, input power and output power for a power amplifier module.

For example, and referring to FIG. 5 for illustration, a predetermined PA supply voltage (VPA) is set to 3.5V, and desired reference output power (Pout_ref) is set to 27 dBm. For an initial input power Pin(0) level, an output power (Pout) of 28 dBm is detected. The input power Pin may then be iteratively adjusted (e.g. reduced) until the desired output power of 27 dBm is achieved.

In case a duty cycled continuous wave input signal is used (e.g. to reduce the average power and have thermal conditions closer to the conditions in the field), the target output power would comprise Pout_ref*duty_cycle.

Figure 6:
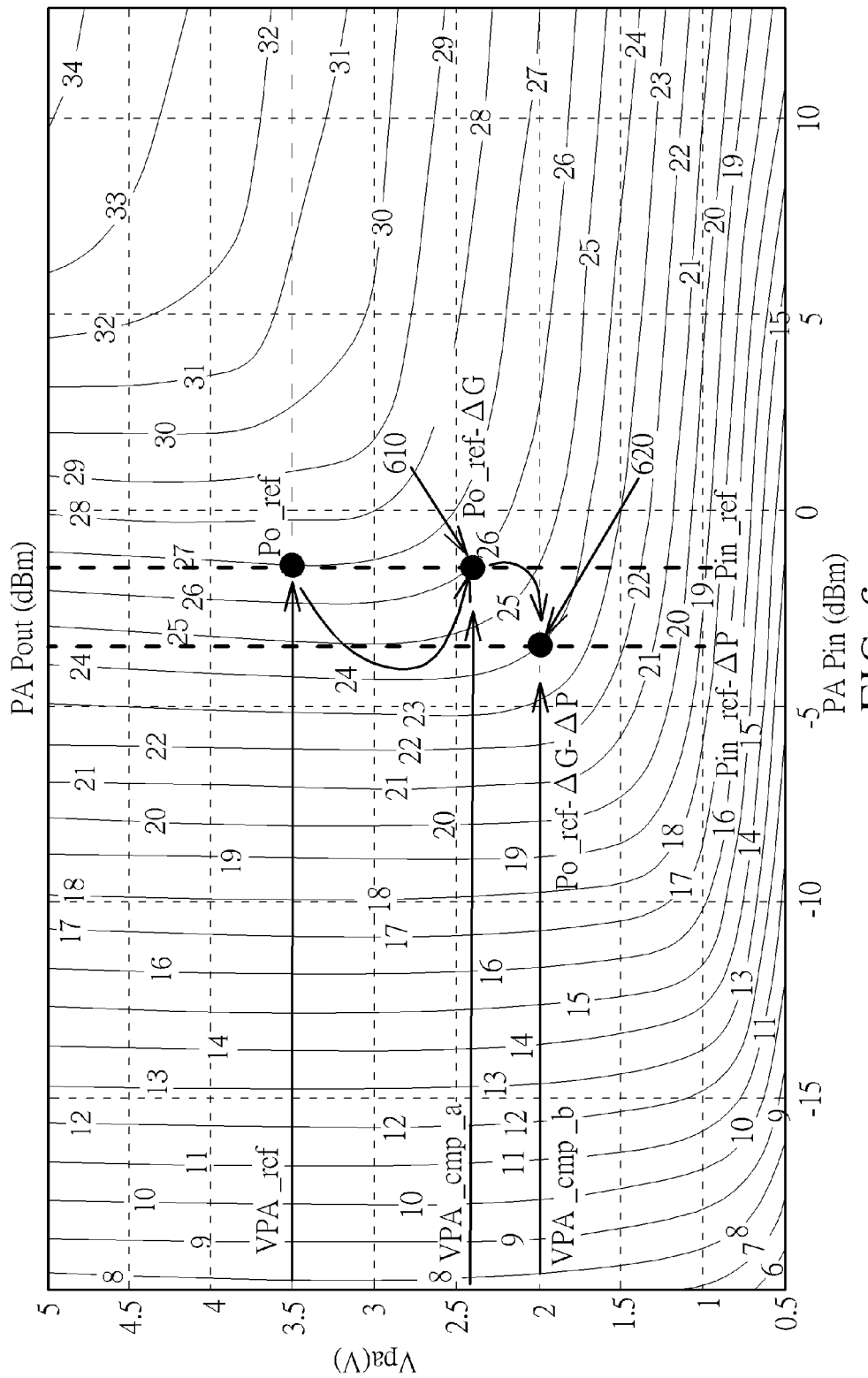

As mentioned above, the reference voltage (VPA_ref) and the predefined reference output power signal (Pout_ref) are chosen such that the PA is biased towards the top end of the 'back-off' (linear) region of operation, in order to maximise PA efficiency. However, because of manufacturing tolerances of the various individual components, the actual VPA_ref voltage at the PA supply will typically vary from part to part, and it is difficult to accurately predict where the upper limit of the back-region for each individual PA module will exist. Accordingly, in the illustrated example, having determined the reference data point values for the upper limit of the 'back-off' (linear) operating region of the PA module, comprising Pin=Pin_ref, Pout=Pout_ref and VPA=VPA_ref, the method moves on to step 425, where the input power for the PA is maintained at Pin_ref, and a PA supply voltage (VPA_cmp_a) is found that produces an output power of the PA module equal to Pout_ref reduced by a predefined gain compression factor ΔG, such that:

$$Pout = Pout\_ref - \Delta G \quad \text{[Equation 3]}$$

where power is expressed in dBm and ΔG in dB. Equivalent implementations of Equation 3 are possible in other units like mW or W. As illustrated in FIG. 4, this may also comprise an iterative process. For example, the PA supply voltage VPA may be iteratively adjusted based on Equation 4 below:

$$VPA(k) = VPA(k-1) + (Pout\_tgt - Pout(k-1)) \cdot \frac{\delta V}{\delta P} \quad \text{[Equation 4]}$$

where Pout_tgt=Pout_ref−ΔG, and $$\frac{\delta V}{\delta P}$$

can be adjusted at each iteration based on the previous iteration. FIG. 6 illustrates at 610 an example in which an input power of Pin_ref is maintained, and a PA supply voltage (VPA_cmp_a) is found that produces an output power of the PA module equal to Pout_ref (27 dBm) reduced by a predefined gain compression factor ΔG of 1 dB; i.e. that produces an output power Pout=26 dBm. Note that the Pout values in Equations 4 could also be expressed in mW or W instead of dBm.

By reducing the voltage power supply to the PA module in this manner to achieve an output power reduced by the gain compression factor ΔG, the PA module is driven more forcefully, allowing it to drop down into its compressed region by a small amount (dependent on the size of the gain compression factor ΔG. As a result, variations in where the upper limit of the back-region for individual PA modules due to manufacturing tolerances may be tolerated. Thus, a 'tolerant' upper limit PA supply voltage (VPA_cmp_a) may be found that achieves a high end output power (Pout_ref−ΔG) for a given reference input power (Pin_ref). Significantly, under such operating conditions, an efficient gain for the PA module is achieved. This method can be used to ensure that all PAs in several wireless communication units operate at the same level of compression, regardless of their actual absolute gain.

The gain compression factor ΔG may be chosen based on any suitable factors. For example, if GPA_ref−ΔG+Pin_max is less than the maximum required peak output power, where GPA_ref represents the PA module gain when Pin=Pin_ref, Pout=Pout_ref and VPA=VPA_ref, then ΔG may be deemed too large.

Additionally and/or alternatively, if for the minimum input power for which the envelope is not de-troughed (as described below) the gain is smaller than GPA_ref−ΔG, and the PA supply voltage VPA is equal to VPA_max, then ΔG may be deemed too small.

Additionally and/or alternatively, if for the minimum input power for which the envelope is not de-troughed the gain is bigger than GPA_ref−ΔG, and VPA is equal to VPA_min, then ΔG may be deemed too large.

Additionally and/or alternatively, the gain compression factor ΔG could be decided according to the transmitter/modulation circuitry, PA module, duplex filter and antenna switch module (ASM) of the application at hand. This would mean that the part-to-part PA gain variation would not be compensated for. However, this would ensure that all devices operate at the same level of gain compression. This guarantees less part-to-part linearity performance variation and similar performance degradation due to temperature changes. Additionally/alternatively, the gain compression factor ΔG could be adjusted depending on the PA module alone. This would compensate for part-to-part PA gain variation, but then different devices would operate at different levels of compression.

The values VPA=VPA_cmp_a, Pin=Pin_ref and Pout=Pout_ref−ΔG may then be used to define a first calibration data point, as illustrated at step 430.

Having found VPA_cmp_a such that Pout=Pout_ref−ΔG for Pin_ref, and defined the first calibration data point, at least one further calibration data point is required to be derived for the initial (coarse) calibration of the envelope tracking system. Accordingly, at step 435 the input power for the PA module is reduced by a predefined amount ΔP, such that (Pin and Pin_ref in dBm, ΔP in dB):

$$Pin = Pin\_ref - \Delta P \quad \text{[Equation 5]}$$

and a PA supply voltage (VPA_cmp_b) is found that produces an output power of the PA module equal to Pout_ref reduced by the predefined gain compression factor ΔG and the predefined amount ΔP, such that:

$$Pout = Pout\_ref - \Delta G - \Delta P \quad \text{[Equation 6]}$$

As illustrated in FIG. 4, this may comprise an iterative process. For example, the PA supply voltage VPA may be iteratively adjusted based on Equation 4 above, where Pout_tgt=Pout_ref−ΔG−ΔP, and $$\frac{\delta V}{\delta P}$$

can be adjusted at each iteration based on the previous iteration. FIG. 6 illustrates at 620 an example in which the input power Pin is set equal to Pin_ref reduced by the predefined amount ΔP of 2 dB, and a PA supply voltage (VPA_cmp_b) is found that produces an output power of the PA module equal to Pout_ref (27 dBm) reduced by the predefined gain compression factor ΔG of 1 dB and by the predefined amount ΔP of 2 dB; i.e. that produces an output power Pout=24 dBm. Note that Equations 5 and 6 could also be expressed in mW, W or any other unit.

In this manner, a PA supply voltage (VPA_cmp_b) is found that maintains a substantially constant gain (GPA_ref−ΔG) for the PA module for the reduced output power Pout=Pout_ref−ΔG−ΔP. Thus, in example embodiments, a mapping function between an instantaneous envelope of a waveform signal to be amplified by the power amplifier module and the power amplifier module supply voltage may be adjusted to achieve a substantially constant power amplifier module gain. In the context of examples of the invention, a substantially constant power amplifier module gain encompasses power amplifier module gain values that are within reasonable and acceptable design/engineering tolerances of a particular implementation.

The values VPA=VPA_cmp_b, Pin=Pin_ref−ΔP and Pout=Pout_ref−ΔG−ΔP may then be used to define a further (e.g. second) calibration data point, as illustrated at step 440. The initial, coarse calibration of the envelope tracking system may then be performed based at least partly on the derived data points, for example comprising population of an envelope tracking VPA lookup table as illustrated at step 445. Such calibration may comprise, say, linear interpolation of the derived data points to define a linear VPA mapping profile. Alternatively such calibration may comprise using the derived data points to offset and/or scale a pre-characterised VPA mapping profile for a give PA module part number.

As previously mentioned, the mapping function between the instantaneous envelope of the transmitted RF signal and the PA supply voltage is critical for optimum performance (efficiency, gain, and adjacent channel power (ACP)). In the example graph showing gain with respect to PA supply voltage VPA and PA input power Pin illustrated in FIG. 7, in which the gain of the PA module is represented by the contours of the illustrated graph, a linearly interpolated mapping function such as described above for the coarse calibration would assume a gain comprising a straight line passing through the data points for VPA_cmp_a 710 and VPA_cmp_b 720.

Figure 7:
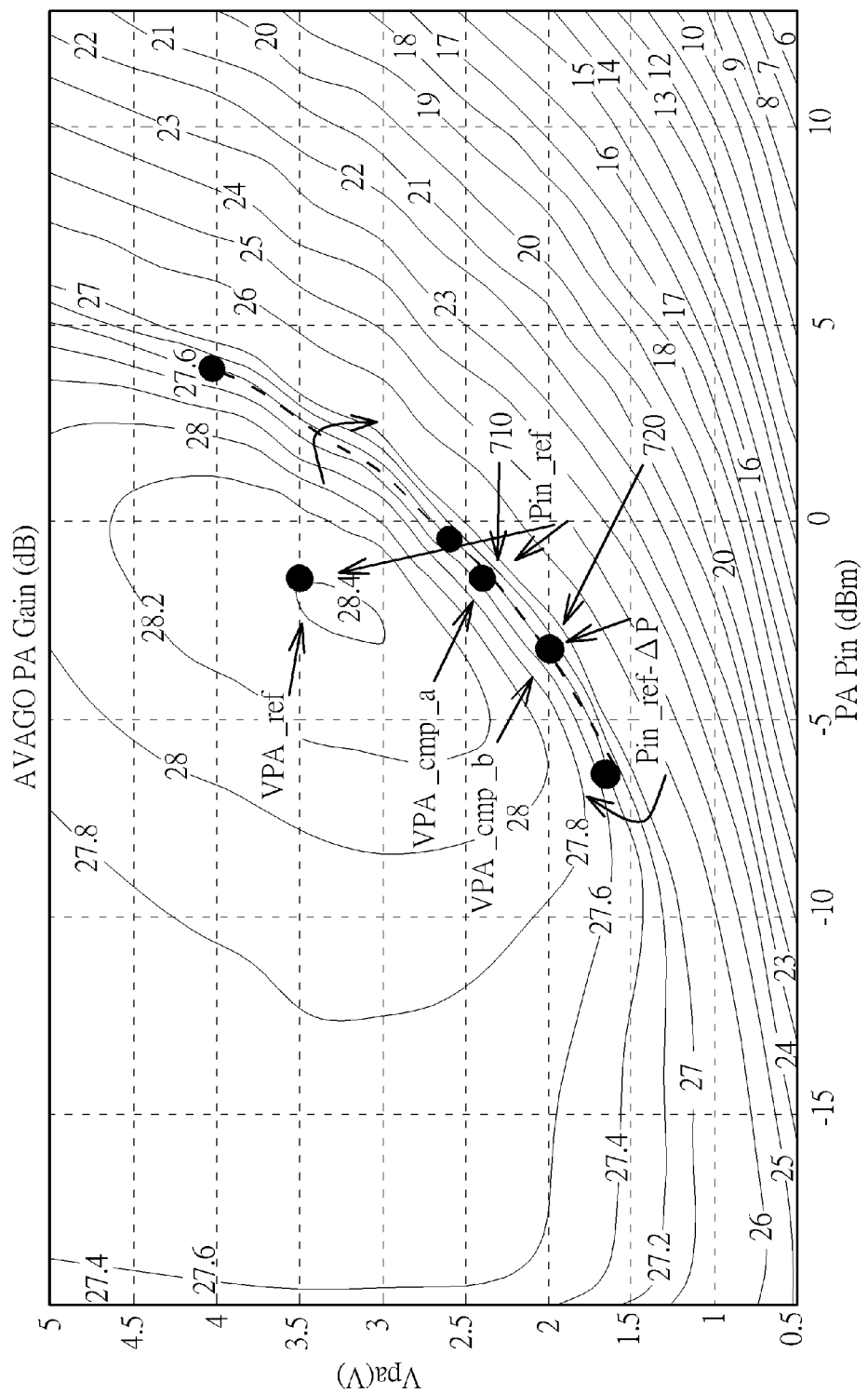
FIG. 7 illustrates a graph showing an example of a relationship between voltage supply, input power and gain for a power amplifier module.

However, as illustrated in FIG. 7 the actual gain of the PA module is not perfectly linear. The waveform trajectory is not exactly on top of a constant gain contour of 27.4 dB, albeit very close. Accordingly, having performed the coarse calibration of the envelope tracking system, the next stage in the method illustrated in FIG. 4 comprises fine-tuning of the envelope tracking system calibration. This calibration fine-tuning stage begins at step 450 where the baseband component(s) is/are configured to produce an envelope modulated waveform signal to be output by the transmit chain of the transceiver, and the envelope tracking path is configured to operate in a tracking mode whereby the PA supply voltage VPA is configured based on the mapping function between the instantaneous envelope of the envelope modulated waveform signal and the PA supply voltage VPA. In the illustrated example, the mapping function between the instantaneous envelope of the envelope modulated waveform signal and the PA supply voltage VPA is defined within the previously mentioned lookup table populated in step 445 whereby Pin_ref maps to VPA_cmp_a and Pin_ref–ΔP maps to VPA_cmp_b.

Figure 8:
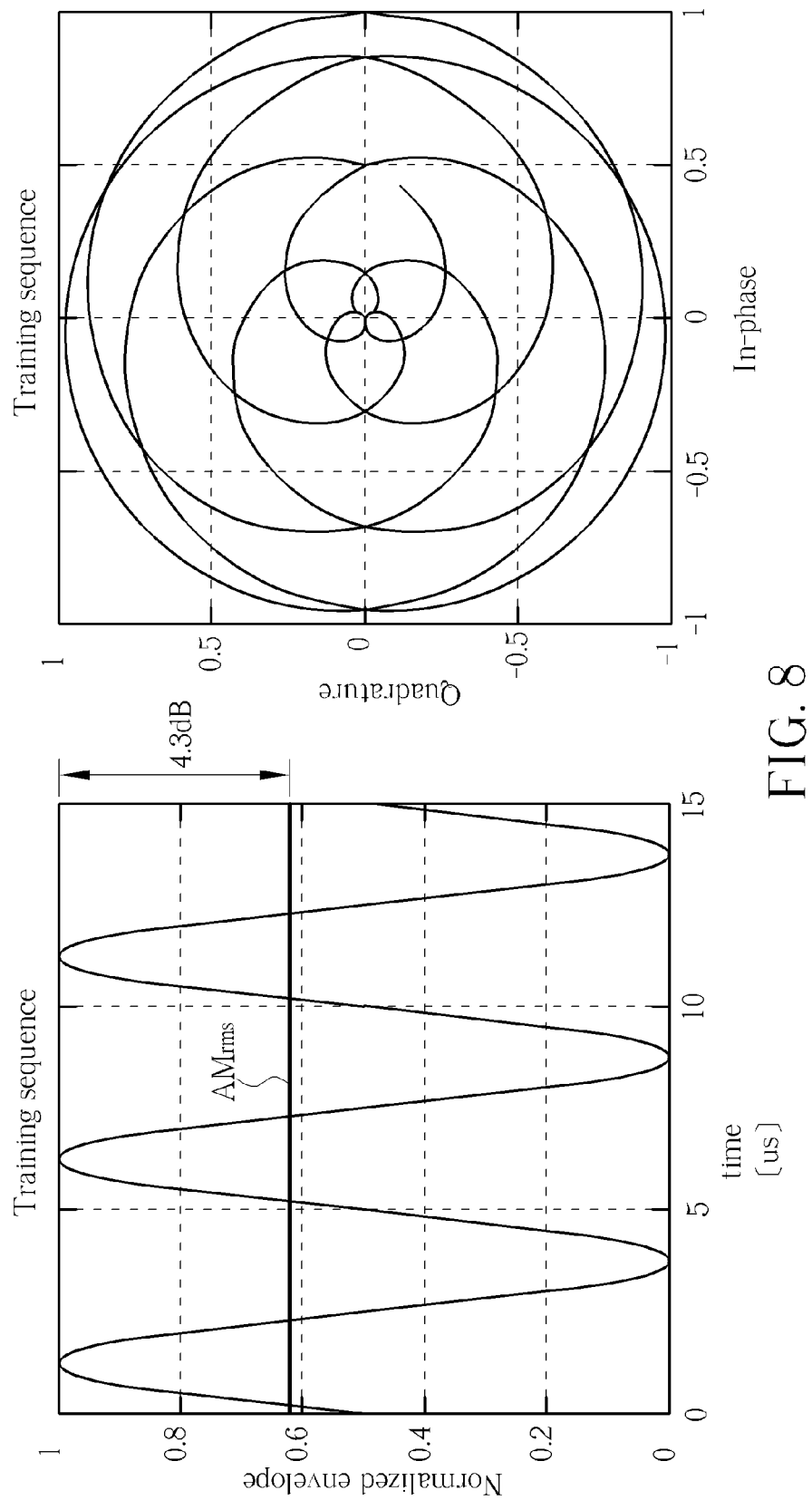
FIG. 8 illustrates graphs showing an example of a training signal.

The envelope modulated waveform signal may be based on any suitable training signal. For example, the training signal may be defined such that it comprises a bandwidth less than the anticipated data bandwidth for the particular transceiver application, and/or such that it comprises a peak to average power ratio equivalent to that of a live uplink modulation for the particular transceiver application. The RMS (root mean square) of the output power may be such that the system is characterised within the wanted window of output powers. An example of a training signal is illustrated in FIG. 8, and defined in Equation 7 below:

$$z(t) = 0.5(1+\sin(\omega_1 t))\exp(j\omega_2 t) \quad \text{[Equation 7]}$$

with a peak to average power ratio of I/Q signals (PAR_IQ)=7 dB, and a peak to average power ratio of RF envelope (PAPR_RF)=4.3 dB.

In addition, any envelope modulation settings required according to the VPA signal characteristics may be configured, for example such as DC (direct current) value, AC (alternating current) swing, etc.

Next, at step 455, instantaneous output values for the PA module are captured, including information such as power and phase of the instantaneous output signal, for example via the detection component 350 in the example illustrate in FIG. 3. Instantaneous gain values are then calculated for the PA module in response to the training signal, at step 460. For example, the captured output signal may be aligned and de-rotated to allow comparison with the input training signal. In the illustrated example, the mapping function between the instantaneous envelope of the modulated waveform signal and the PA supply voltage VPA (e.g. the lookup table populated in step 445) is then adjusted, at 465, in order to achieve a substantially constant gain.

As illustrated in FIG. 4, this may also comprise an iterative process. For example, the PA supply voltage VPA may be iteratively adjusted based on Equation 8 below:

$$VPA(k) = VPA(k-1) + (\text{Gain\_tgt} - \text{Gain}(k-1)) \cdot \frac{\delta V}{\delta G} \quad \text{[Equation 8]}$$

where Gain_tgt is the target constant gain in dB (e.g. GPA_ref–ΔG), and $$\frac{\delta V}{\delta G}$$

can be adjusted at each iteration based on the previous iteration. An equivalent formula to Equation 8 based on power measurements rather than gain measurements can be used instead if deemed more convenient. Also an equivalent formulation of Equation 8 with the gain expressed in the linear domain rather than in dB is possible.

Figure 9:
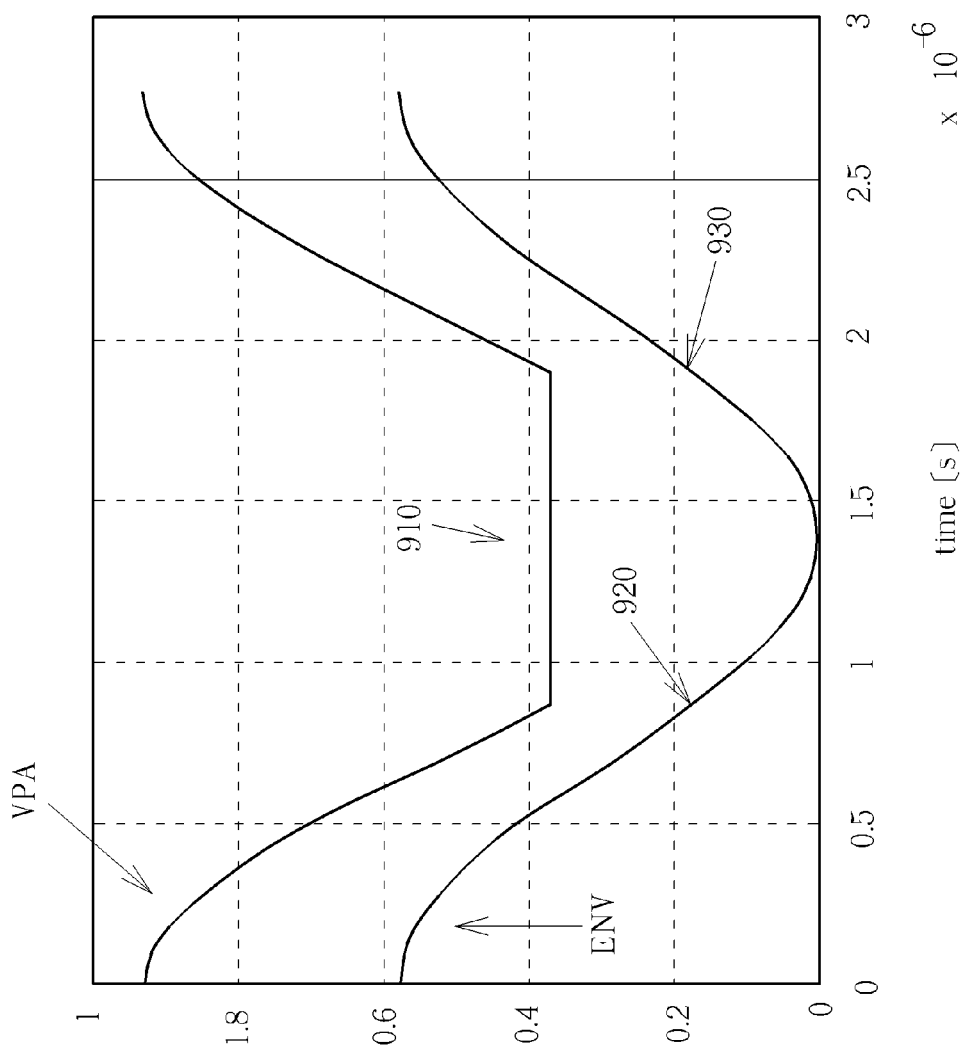
FIG. 9 illustrates a graph showing an example of a voltage supply for a power amplifier module being de-troughed.

In order to avoid very low PA supply voltage VPA levels, and/or to limit the PA supply voltage VPA AC swing, the PA supply voltage VPA may be de-troughed within the mapping function between the instantaneous envelope of the transmitted RF signal and the PA supply voltage, for example as illustrated at 910 in FIG. 9 whereby the PA supply voltage VPA is restricted within the mapping function between the instantaneous envelope of the transmitted RF signal and the PA supply voltage to a minimum value.

As also mentioned above, timing alignment between the instantaneous envelope of the transmitted RF signal and the PA supply voltage modulation is critical to system performance. Initially, the envelope tracking path may be configured to comprise a default timing alignment with respect to the modulated waveform input signal at step 450. If the PA supply voltage VPA and the instantaneous envelope of the transmitted RF signal are perfectly aligned, such as illustrated in FIG. 9, the instantaneous gain of the PA at the point of entering a trough, indicated generally at 920, should be the same as the instantaneous gain of the PA at the point of leaving the trough, indicated generally at 930.

Figure 10:
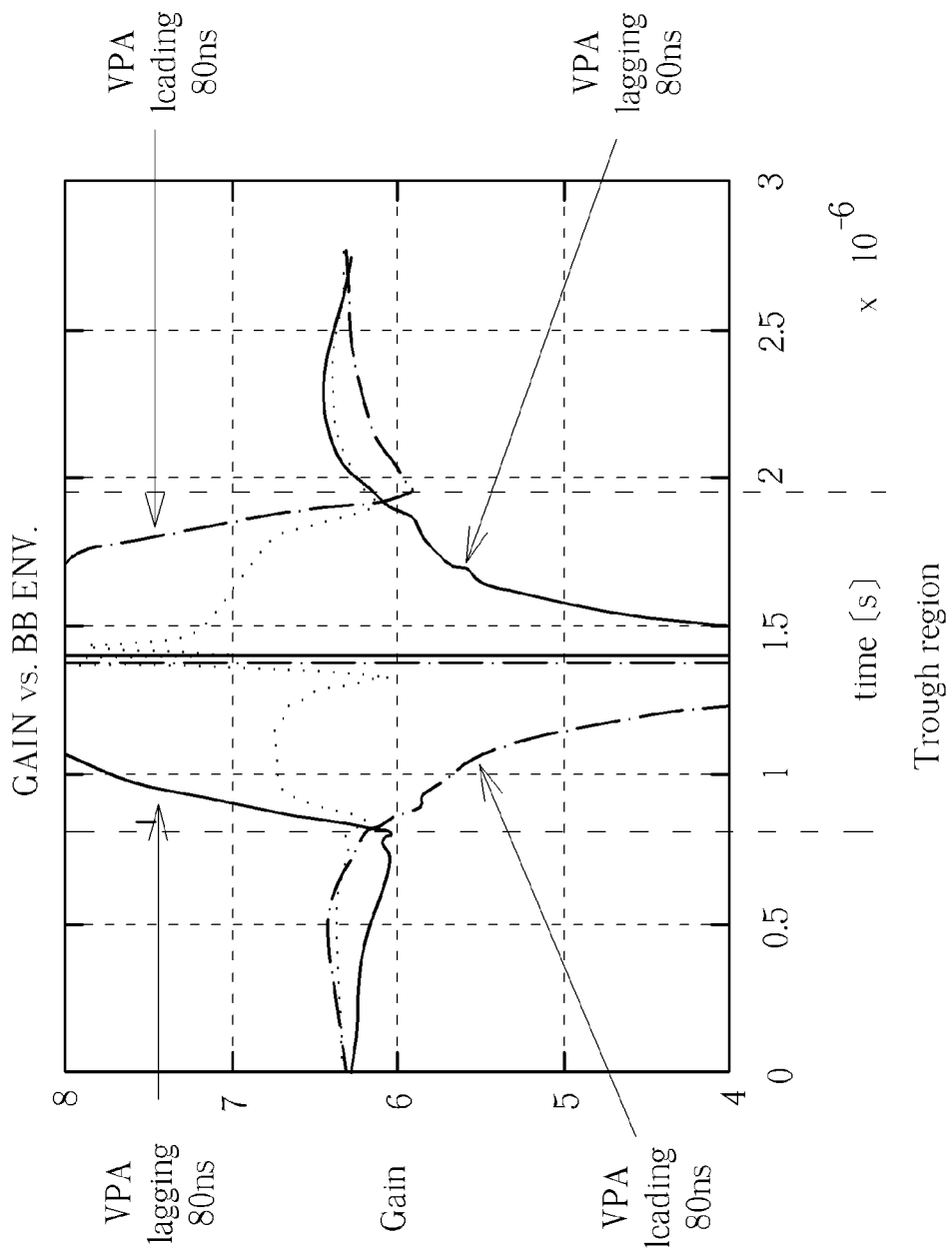
FIG. 10 illustrates a graph showing an example of a relationship between power amplifier gain and voltage supply envelope tracking alignment.

However, and as illustrated in FIG. 10, if the PA supply voltage VPA is lagging with respect to the instantaneous envelope of the transmitted RF signal, the PA supply voltage VPA will be too high at the point of entering the trough, and too low at the point of leaving the trough. As a result, the instantaneous gain of the PA module at the point of entering the trough will be too high, whilst the instantaneous gain of the PA module at the point of leaving the trough 30 will be too low. Conversely, if the PA supply voltage VPA is leading with respect to the instantaneous envelope of the transmitted RF signal, the PA supply voltage VPA will be too low at the point of entering the trough, and too high at the point of leaving the trough. As a result, the instantaneous gain of the PA module at the point of entering the trough will be too low, whilst the instantaneous gain of the PA module at the point of leaving the trough will be too high.

Based on this gain symmetry, a timing alignment setting between the envelope tracking path of the envelope tracking system and a transmit path of the RF transmitter module may be iteratively updated based on Equation 9 below:

$$Del(k) = \quad \text{[Equation 9]}$$
$$Del(k-1) + (\text{GPA\_in}(k-1) - \text{GPA\_out}(k-1)) \cdot \frac{\delta D}{\delta G}$$

where GPA_in is the instantaneous gain of the PA module at the point of entering the trough, GPA_out is the instantaneous gain of the PA module at the point of leaving the trough, and $$\frac{\delta D}{\delta G}$$

can be adjusted at each iteration based on the previous iteration.

Figure 11:
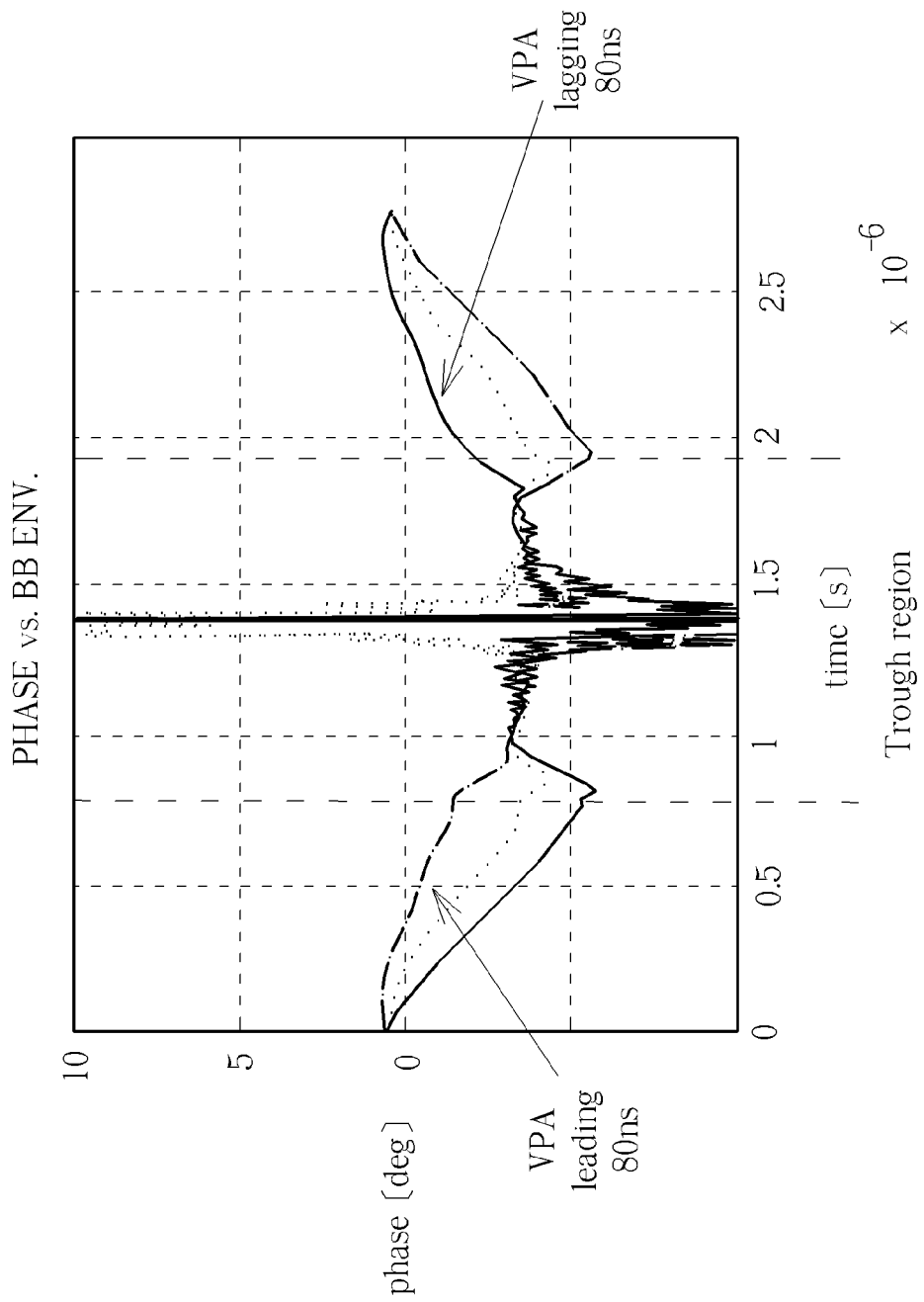
FIG. 11 illustrates a graph showing an example of a relationship between power amplifier added phase and voltage supply envelope tracking alignment.

As illustrated in FIG. 11, which illustrates the phase added to the signal in Equation 7 by the PA as a function of time, the added phase response for the output PA training signal shows a similar symmetry to the gain of the PA supply voltage VPA. Thus, additionally/alternatively, for example at the same time that the magnitude of the gain is calculated, the added phase of the output PA training signal may also be calculated, and based on this phase symmetry the alignment between the PA supply voltage VPA and the instantaneous envelope of the transmitted RF signal may be iteratively updated based on Equation 10 below:

$$Del(k) = Del(k-1) + (\text{Phase\_in}(k-1) - \text{Phase\_out}(k-1)) \cdot \frac{\delta P}{\delta G}$$ [Equation 10]

where Phase_in is the added phase of the output PA training signal at the point of entering the trough, Phase_out is the added phase of the output PA training signal at the point of leaving the trough, and $$\frac{\delta P}{\delta G}$$

can be adjusted at each iteration based on the previous iteration.

Accordingly, and referring back to FIG. 4, in the illustrated example, having adjusted the mapping function between the instantaneous envelope of the modulated waveform signal and the PA supply voltage in order to achieve a substantially constant gain, at step 465, the method moves on to step 470 where instantaneous gain values for the power amplifier module and/or the added phase of the output PA training signal at trough entry and exit points are calculated. The alignment of the envelope tracking path of the envelope tracking system within the transmit path is then adjusted based on a symmetry of the calculated instantaneous gain values for the power amplifier module and/or the added phase of the output PA training signal, to align the envelope tracking PA supply voltage VPA to the instantaneous envelope of a waveform signal to be amplified by the PA module.

As a by-product of the envelope to PA supply voltage mapping function and alignment characterisation, the AM2AM (amplitude modulation to amplitude modulation) and AM2PM (amplitude modulation to phase modulation) responses for the transmit chain of the RF transceiver architecture are available. If the perfect constant gain VPA mapping has been achieved, the AM2AM response will be ideal (linear). However, achieving such a constant gain VPA mapping does not guarantee an ideal (constant) AM2PM response. In some example embodiments, it is contemplated that the AM2PM response may be used for digital pre-distortion (DPD) of the RF signal, assuming there is sufficient bandwidth in the forward path. For example, digital pre-distortion may be applied to waveform signals prior to being provided to the input of the PA module, e.g. within the baseband component 310 in the example illustrated in FIG. 3. In some examples, it is contemplated that AM2PM pre-distortion may be applied in this manner, and may be applied to the training signal used during the fine tuning of the mapping function calibration and alignment steps of the method of FIG. 4. For example, a default AM2PM pre-distortion may initially be configured and applied at step 450. The AM2PM pre-distortion may then be refined at each iteration of steps 465 and 475. In this manner, once the constant gain mapping has be achieved, and the optimum timing alignment setting found, both the AM2PM response and the AM2PM response may be substantially ideal.

In some examples, for example depending on characteristics of the PA supply voltage modulator 320 in the example illustrated in FIG. 3 and/or on the intended application for the RF transmitter module 300, the calibration and alignment steps 455 to 475 in the example method illustrated in FIG. 4 may need to be repeated for different output power ranges of the PA module, which require different VPA signal levels. Accordingly, if it is determined that these steps need repeating, at step 480, the method loops back to step 455. Otherwise the method ends at step 485.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of calibrating an envelope tracking system for a supply voltage for a power amplifier module within a radio frequency (RF) transmitter module of a wireless communication unit; the method comprising, within at least one signal processing module of the wireless communication unit:
    calibrating a mapping function between at least one instantaneous envelope of a waveform signal to be amplified and the power amplifier module supply voltage by setting an envelope tracking path of the transmitter module into a characterisation mode in which the power amplifier module supply voltage is not dependent on the at least one instantaneous envelope of a received waveform signal;
    applying a training signal comprising an envelope that varies with time to an input of the RF transmitter module;
    receiving at least an indication of at least one instantaneous output signal value for the power amplifier module in response to the training signal;
    calculating at least one instantaneous gain value based at least partly on the received output signal values; and
    adjusting the mapping function between an instantaneous envelope of a waveform signal to be amplified by the power amplifier module and the power amplifier module supply voltage to achieve a substantially constant power amplifier module gain.

2. The method of claim 1, wherein the method comprising iteratively:
    receiving at least an indication of at least one instantaneous output signal value for the power amplifier module in response to the training signal;
    calculating at least one instantaneous gain value based at least partly on the received at least one output signal value; and
    adjusting a mapping function between at least one instantaneous envelope of a waveform signal to be amplified and the power amplifier module supply voltage to achieve the substantially constant power amplifier module gain.

3. The method of claim 1, wherein calculating at least one instantaneous gain value comprises aligning and de-rotating received at least an indication of the at least one instantaneous output signal value to allow comparison with the training signal.

4. The method of claim 1, wherein the supply voltage for a power amplifier module is de-troughed within the mapping function between at least one instantaneous envelope of a waveform signal to be amplified and the power amplifier module supply voltage.

5. The method of claim 1, wherein calibrating the mapping function between the at least one instantaneous envelope of the waveform signal to be amplified and the power amplifier module supply voltage by setting the envelope tracking path of the transmitter module into the characterisation mode in which the power amplifier module supply voltage is not dependent on the at least one instantaneous envelope of the received waveform signal comprises:
    setting an envelope tracking path of the transmitter module into a characterisation mode in which the power amplifier module supply voltage is not dependent on the at least one instantaneous envelope of a received waveform signal;
    applying a continuous wave training signal comprising a constant envelope to the input of the RF transmitter module;
    deriving the first calibration data point for the power amplifier module for which the power amplifier module comprises a first gain;
    deriving the at least one further calibration data point for the power amplifier module for which the power amplifier module comprises the first gain; and
    calibrating the mapping function between the at least one instantaneous envelope of the waveform signal to be amplified and the power amplifier module supply voltage based at least partly on the first and at least one further calibration data points.

6. The method of claim 5, wherein calibrating the mapping function between the at least one instantaneous envelope of a waveform signal to be amplified and the power amplifier module supply voltage based at least partly on the first and at least one further calibration data points comprises performing linear interpolation of the derived data points to define a linear mapping profile.

7. The method of claim 5, wherein calibrating the mapping function between the at least one instantaneous envelope of a waveform signal to be amplified and the power amplifier module supply voltage based at least partly on the first and at least one further calibration data point comprises offsetting and/or scaling a pre-characterised mapping profile.

8. The method of claim 5, wherein deriving the first calibration data point comprises:
    setting an input power for the power amplifier module to a first calibration data point input power;
    finding a first calibration data point power amplifier module supply voltage that produces an output power for the power amplifier module equal to a first calibration data point output power; and
    derive the first calibration data point based at least partly on the first calibration data point input power and the first calibration data point power amplifier module supply voltage.

9. The method of claim 8, wherein the method further comprises:
    setting a reference power amplifier module supply voltage;
    finding a reference input power for the power amplifier module that produces an output power for the power amplifier module equal to a reference output power, wherein the reference power amplifier module supply voltage and the reference output power are chosen such that the power amplifier module is biased towards an upper limit of a back-off region of operation; and configuring the first calibration data point input power equal to the reference input power, and the first calibration data point output power equal to the reference output power less a gain compression factor AG.

10. The method of claim 9, wherein the gain compression factor AG is chosen based at least partly on at least one of:
GPA_ref−ΔG+Pin_max≥a maximum required peak output power, where GPA_ref represents a power amplifier module gain when Pin=Pin_ref, Pout=Pout_ref and VPA=VPA_ref;

for a minimum input power for which VPA is not detroughed and the PA supply voltage VPA is equal to VPA_max, gain≥GPA_ref−ΔG;

for a minimum input power for which VPA is not detroughed and VPA is equal to VPA_min, gain≤GPA_ref−ΔG; and at least one of the transmitter/modulation circuitry, PA module, duplex filter and antenna switch module of the application at hand.

11. The method of claim 9, wherein deriving the second calibration data point comprises:

setting an input power for the power amplifier module to a second calibration data point input power, the second calibration data point input power being equal to the first calibration data point input power reduced by a predefined amount ΔP;

finding a second calibration data point power amplifier module supply voltage that produces an output power for the power amplifier module equal to a second calibration data point output power, the second calibration data point output power being equal to the first calibration data point output power reduced by the predefined amount ΔP; and deriving the second calibration data point based at least partly on the second calibration data point input power and the second calibration data point power amplifier module supply voltage.

12. The method of claim 5, wherein the method further comprises, having calibrated the mapping function between the at least one instantaneous envelope of a waveform signal to be amplified and the power amplifier module supply voltage based at least partly on the first and at least one further calibration data points with envelope track path set to a characterisation, setting the envelope tracking path of the transmitter module into an envelope tracking mode; the envelope tracking mode being based on the calibrated mapping function between the at least one instantaneous envelope of a received waveform signal and the power amplifier module supply voltage.

13. The method of claim 1, wherein the training signal comprising an envelope that varies with time to an input of the RF transmitter module is defined according to at least one of a bandwidth of the training signal being less than an anticipated bandwidth for an intended application for the RF transmitter module;

the training signal comprises a peak to average power ratio equivalent to that of a live uplink modulation for an intended application for the RF transmitter module;

a root mean square of an output power of the power amplifier module is such that the system is characterised within a wanted window of output powers for at least one intended application for the RF transmitter module; and the training signal is defined by:

$z(t)=0.5(1+\sin(\omega_1 t))\exp(j\omega_2 t)$.

14. The method of claim 1, wherein the at least one instantaneous output signal value comprises at least one of: instantaneous power, instantaneous envelope, instantaneous phase.

15. A non-transitory computer program product comprising executable program code for calibrating an envelope tracking system for a supply voltage for a power amplifier module within a radio frequency (RF) transmitter module of a wireless communication unit, the executable program code operable for, when executed at a communication unit, performing the method of claim 1.

16. A method of calibrating an envelope tracking system for a supply voltage for a power amplifier module within a radio frequency (RF) transmitter module of a wireless communication unit; the method comprising, within at least one signal processing module of the wireless communication unit:

applying a training signal comprising an envelope that varies with time to an input of the RF transmitter module;

receiving at least an indication of at least one instantaneous output signal value for the power amplifier module in response to the training signal;

calculating at least one instantaneous gain value based at least partly on the received output signal values; and adjusting a mapping function between an instantaneous envelope of a waveform signal to be amplified by the power amplifier module and the power amplifier module supply voltage to achieve a substantially constant power amplifier module gain; wherein the method comprises adjusting a mapping function between the at least one instantaneous envelope of a waveform signal to be amplified and the power amplifier module supply voltage to achieve the substantially constant power amplifier module gain based at least partly on:

$$VPA(k) = VPA(k-1) + (\text{Gain\_tgt} - \text{Gain}(k-1)) \cdot \frac{\delta V}{\delta G}.$$

17. A method of calibrating an envelope tracking system for a supply voltage for a power amplifier module within a radio frequency (RF) transmitter module of a wireless communication unit; the method comprising, within at least one signal processing module of the wireless communication unit:

applying a training signal comprising an envelope that varies with time to an input of the RF transmitter module;

receiving at least an indication of at least one instantaneous output signal value for the power amplifier module in response to the training signal;

calculating at least one instantaneous gain value based at least partly on the received output signal values; and adjusting a mapping function between an instantaneous envelope of a waveform signal to be amplified by the power amplifier module and the power amplifier module supply voltage to achieve a substantially constant power amplifier module gain;

wherein the method further comprises applying AM2PM pre-distortion to the training signal comprising an envelope that varies with time; and refining the AM2PM pre-distortion applied to the training signal upon each iteration of:

adjusting the mapping function between at least one instantaneous envelope of a waveform signal to be amplified and the power amplifier module supply voltage to achieve a substantially constant power amplifier module gain; and/or adjusting the timing alignment between the envelope tracking path of the envelope tracking system and a transmit path of the RF transmitter to align the envelope tracking power amplifier module supply voltage to the at least one instantaneous envelope of a waveform signal to be amplified.

18. A communication unit comprising:

a radio frequency (RF) transmitter module comprising an envelope tracking system for a supply voltage for a power amplifier module within the RF transmitter module; and at least one signal processing module for calibrating envelope tracking system and arranged to:

calibrating a mapping function between at least one instantaneous envelope of a waveform signal to be amplified and the power amplifier module supply voltage by setting an envelope tracking path of the transmitter module into a characterisation mode in which the power amplifier module supply voltage is not dependent on the at least one instantaneous envelope of a received waveform signal;

apply a training signal comprising an envelope that varies with time to an input of the RF transmitter module;

receive at least an indication of instantaneous output signal values for the power amplifier module in response to the training signal;

calculate instantaneous gain values based at least partly on the received output signal values; and adjust the mapping function between an instantaneous envelope of a waveform signal to be amplified by the power amplifier module and the power amplifier module supply voltage to achieve a substantially constant power amplifier module gain.

19. An integrated circuit for a communication unit comprising a radio frequency (RF) transmitter module comprising an envelope tracking system for a supply voltage for a power amplifier module within the RF transmitter module; wherein the integrated circuit comprises:

at least one signal processing module for calibrating the envelope tracking system and arranged to:

calibrate a mapping function between at least one instantaneous envelope of a waveform signal to be amplified and the power amplifier module supply voltage by setting an envelope tracking path of the transmitter module into a characterisation mode in which the power amplifier module supply voltage is not dependent on the at least one instantaneous envelope of a received waveform signal;

apply a training signal comprising an envelope that varies with time to an input of the RF transmitter module;

receive at least an indication of instantaneous output signal values for the power amplifier module in response to the training signal;

calculate instantaneous gain values based at least partly on the received output signal values; and adjust the mapping function between an instantaneous envelope of a waveform signal to be amplified by the power amplifier module and the power amplifier module supply voltage to achieve a substantially constant power amplifier module gain.

20. A method of calibrating an envelope tracking system for a supply voltage for a power amplifier module within a radio frequency (RF) transmitter module of a wireless communication unit; the method comprising, within at least one signal processing module of the wireless communication unit:

calibrating a mapping function between at least one instantaneous envelope of a waveform signal to be amplified and the power amplifier module supply voltage based at least partly on a first and at least one further calibration data points, comprising performing interpolation of the derived data points to define a mapping profile;

applying a training signal comprising an envelope that varies with time to an input of the RF transmitter module;

receiving at least an indication of at least one instantaneous output signal value for the power amplifier module in response to the training signal;

calculating at least one instantaneous gain value based at least partly on the received output signal values; and adjusting the mapping function between an instantaneous envelope of a waveform signal to be amplified by the power amplifier module and the power amplifier module supply voltage to achieve a substantially constant power amplifier module gain.

* * * * *